United States Patent
Lee et al.

(10) Patent No.: US 7,142,422 B2
(45) Date of Patent: Nov. 28, 2006

(54) HEAT DISSIPATION DEVICE

(75) Inventors: Hsieh Kun Lee, Tu-Chen (TW);
Wan-Lin Xia, Shenzhen (CN); He-Ben Liu, Shenzhen (CN)

(73) Assignees: Fu Zhun Precision Industry (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 149 days.

(21) Appl. No.: 10/900,953

(22) Filed: Jul. 27, 2004

(65) Prior Publication Data
US 2005/0036289 A1    Feb. 17, 2005

(30) Foreign Application Priority Data
Aug. 13, 2003  (TW)  ............... 92214633 U

(51) Int. Cl.
*H05K 7/20*    (2006.01)
(52) U.S. Cl. .............. 361/695; 361/700; 361/704; 257/706; 257/712; 257/714; 257/715; 257/718; 174/15.1; 174/15.2; 174/16.1; 174/16.3; 165/80.3; 165/80.4; 165/104.33
(58) Field of Classification Search ............ 361/704, 361/719; 165/80.3, 185; 174/16.1, 16.3
See application file for complete search history.

(56) References Cited

U.S. PATENT DOCUMENTS

| | | | |
|---|---|---|---|
| 6,330,908 B1 * | 12/2001 | Lee et al. | 165/185 |
| 6,336,499 B1 * | 1/2002 | Liu | 165/80.3 |
| 6,404,634 B1 | 6/2002 | Mann | |
| 6,450,250 B1 * | 9/2002 | Guerrero | 165/104.33 |
| 6,479,895 B1 | 11/2002 | Lee et al. | |
| 6,535,385 B1 * | 3/2003 | Lee | 361/697 |
| 6,640,882 B1 * | 11/2003 | Dowdy et al. | 165/80.3 |
| 6,657,865 B1 * | 12/2003 | Tseng et al. | 361/709 |
| 6,741,470 B1 * | 5/2004 | Isenburg | 361/704 |
| 6,826,054 B1 * | 11/2004 | Liu | 361/719 |
| 6,835,072 B1 * | 12/2004 | Simons et al. | 439/66 |
| 6,886,627 B1 * | 5/2005 | Kozyra et al. | 165/80.3 |

FOREIGN PATENT DOCUMENTS

| CN | 2429917 Y | 5/2001 |
|---|---|---|
| CN | 2514397 Y | 10/2002 |

* cited by examiner

*Primary Examiner*—Boris Chervinsky
(74) *Attorney, Agent, or Firm*—Wei Te Chung

(57) ABSTRACT

A heat dissipation device includes a mounting plate (21) for mounting the heat dissipation device to a circuit board (3) on which a CPU (4) and a plurality of capacitors (31) are mounted, a heat sink (20), a core (25), and a fan (1) mounted on the heat sink. The heat sink locates above the mounting plate and includes a hollow cylinder (202) and a plurality of curved fins (204) extending outwardly from the cylinder. The core includes a base (26) for contacting the CPU and a post (27) extending from the base through the mounting plate to be received in the cylinder. The mounting plate is spaced from the circuit board to allow the capacitors to locate between the mounting plate and the circuit board. The mounting plate defines a plurality of openings (23) for providing access for cooled air from the fan to the CPU and the capacitors.

20 Claims, 3 Drawing Sheets

HEAT DISSIPATION DEVICE

BACKGROUND OF THE INVENTION

1. Field of the Invention

The present invention relates to a heat dissipation device for electronic components, and particularly to a heat dissipation device for a central processing unit with a plurality of electronic components located therearound.

2. Related Art

Electronic devices such as central processing units (CPUs) generate a lot of heat during normal operation. This can deteriorate their operational stability and damage associated electronic devices. Thus the heat must be removed quickly to ensure normal operation. A heat dissipation device is often attached to a top surface of a CPU, to remove heat therefrom.

A conventional heat dissipation device comprises a rectangular base and a plurality fins arranged on the base. The base is made of copper and the fins are made of aluminium. The base is used to contact a CPU for transferring heat from the CPU to the fins. A fan is often attached on the heat sink for enhancing heat dissipation efficiency of the heat dissipation device. The base has a large surface for allowing more fins to mount thereon to improve heat dissipation efficiency of the heat dissipation device. However, this kind of base is prone to interfere with other electronic components of a printed circuit board around the CPU since the base is close to the printed circuit board. Thus, the other electronic components must be removed away from the base to another location on the printed circuit board, thereby wasting space of the printed circuit board under the base. Furthermore, the base has only a small area contact the CPU. The other area of the base is far from the CPU and cannot efficiently transfer heat from the CPU to the fins.

SUMMARY OF THE INVENTION

Accordingly, an object of the present invention is to provide a heat dissipation device which will not waste space of a printed circuit board.

Accordingly, an object of the present invention is to provide a heat dissipation device which can efficiently dissipate heat from an electronic component.

To achieve the above-mentioned objects, a heat dissipation device in accordance with the present invention comprises a mounting plate for mounting the heat dissipation device to a heat generating component, a heat sink, a core, and a fan mounted on the heat sink. The heat sink locates above the mounting plate and comprises a hollow cylinder and a plurality of fins extending outwardly from the cylinder. The core comprises a base for contacting the heat generating component and a post extending from the base through the mounting plate to be received in the cylinder thereby sandwiching the mounting plate between the base and heat sink. The mounting plate is spaced from the circuit board to allow the capacitors to locate between the mounting plate and the circuit board. The mounting plate defines a plurality of openings for providing access for cooled air from the fan to the heat generating component.

Other objects, advantages and novel features of the present invention will be drawn from the following detailed description of a preferred embodiment of the present invention with attached drawings, in which:

DATAILED DESCRIPTION OF THE INVENTION

Figure 1:
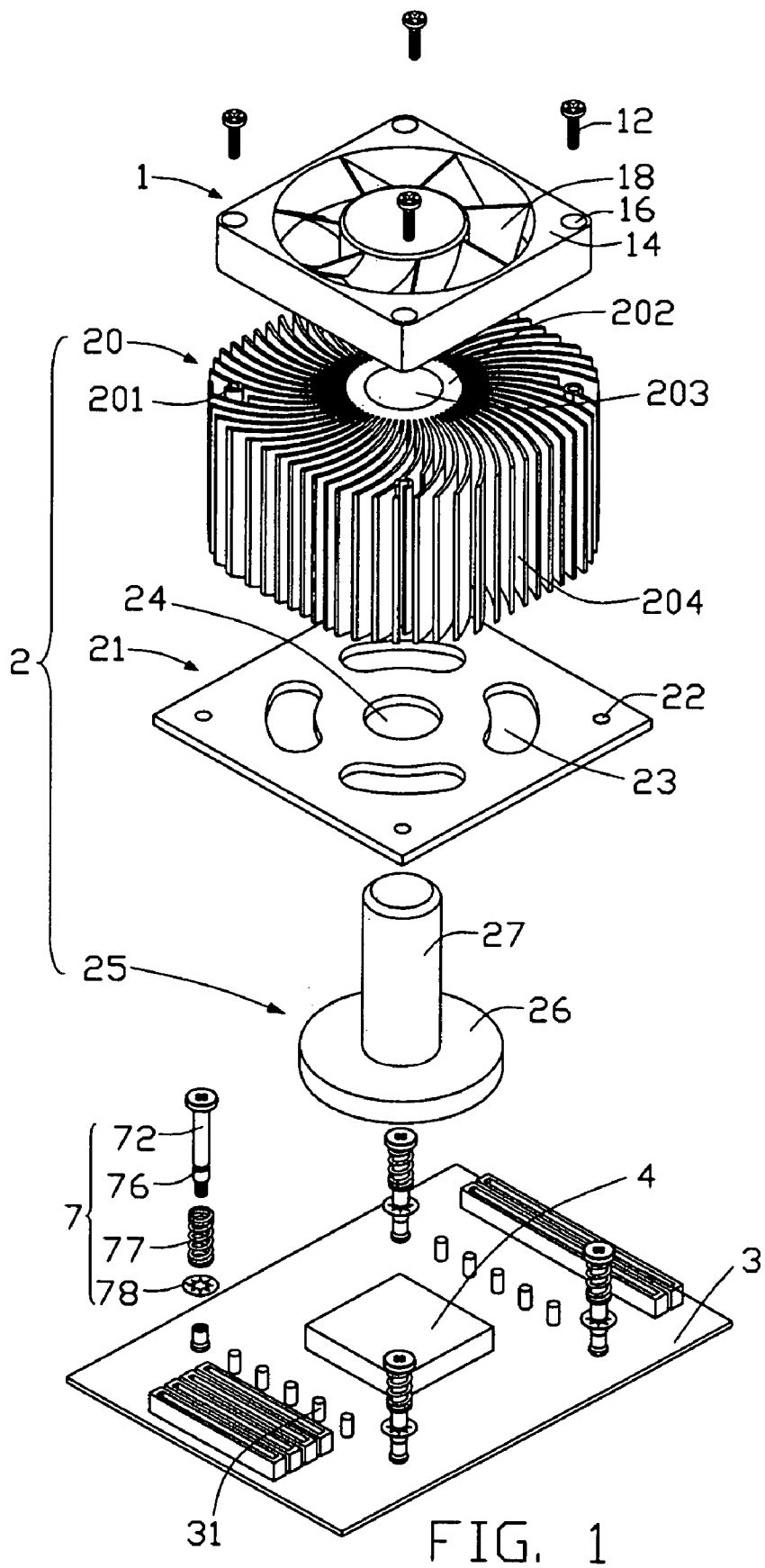
FIG. 1 is an exploded, isometric view of a heat dissipation device in accordance with a preferred embodiment of the present invention, together with a printed circuit board.
Figure 2:
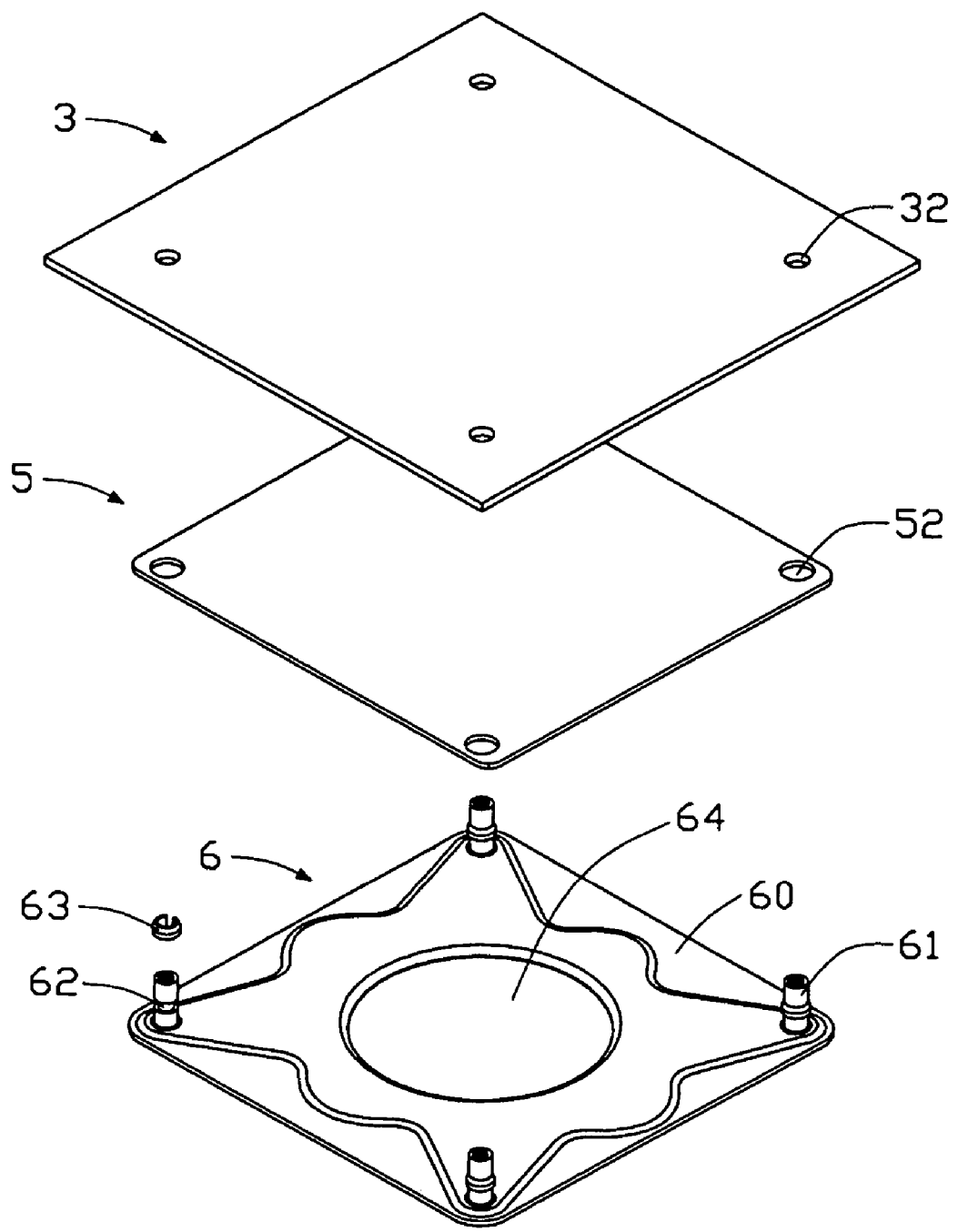
FIG. 2 is an exploded view of the printed circuit board, a back plate and an insulative plate of the heat dissipation device of FIG. 1.

Referring to FIGS. 1 and 2, a heat dissipation device in accordance with the preferred embodiment of the present invention comprises a fan 1, a radiator 2, a back plate 6 and a plurality of fasteners 7. The fan 1 is for being attached on the radiator 2 and comprises a rectangular frame 14 and a plurality of vanes 18 installed in a central opening of the frame 14. The frame 14 defines four through holes 16 in four corners thereof.

The radiator 2 comprises a heat sink 20, a rectangular mounting plate 21, and a core 25. The heat sink 20 comprises a central cylinder 202 defining a through aperture 203 therein, and a plurality of spaced curviform fins 204 extending radially from the cylinder 202. Four screw holes 201 are defined in free ends of four fins 204 for engaging with four screws 12 which extend through the through holes 16 of the fan 1, respectively. The mounting plate 21 defines a through aperture 24 in a center thereof, and four through openings 23 surrounding the through aperture 24 for guiding cooled air flow from the fan 1 to a Central Processing Unit (CPU) 4 mounted on a printed circuit board (PCB) 3. Four mounting holes 22 are defined in four corners of the mounting plate 21. The core 25 comprises a base 26 and a pole 27 extending upwardly from a center of the base 26. A diameter of the pole 27 of the core 25 is slightly larger than a diameter of the through aperture 203 of the heat sink 20. In assembly of the radiator 2, the pole 27 of the core 25 extends through the through aperture 24 of the mounting plate 21 to enter the through aperture 203 of the heat sink 20. The pole 27 is interferentially received in the through aperture 203. The radiator 2 is therefore assembled together. In an alternative embodiment, the pole 27 of the core 25 can be fixedly received in the through aperture 203 by welding or the other fastening means. The pole 27 may be a hollow heat pipe filled with coolant, or a solid metal rod made from copper or aluminum etc.

The PCB 3 further comprises a plurality of electronic components 31, such as capacitors, on opposite sides of the CPU 4. Four through holes 32 are defined in four corners of the PCB 3.

Referring to FIG. 2, the back plate 6 is for being attached below the PCB 3. The back plate 6 comprises a body 60 defining an opening 64 in a center thereof, and four hollow posts 61 extending upwardly from four corner portions of the body 60. Each post 61 defines inner threads in an inner surface thereof. An annular groove 62 is defined in an outer surface of each post 61 receiving a locking ring 63 therein after the post 61 extends through a corresponding through hole 32 of the PCB 3 thereby pre-assembling the back plate 6 to the PCB 3. An insulative plate 5 may be sandwiched between the PCB 3 and the back plate 6 for insulating the PCB 3 and the back plate 6. The insulative plate 5 defines four through holes 52 corresponding to the through holes 32 of the PCB 3.

Referring to FIG. 1 again, the fasteners 7 each comprises a bolt 72, a spring 77, and a locking ring 78. The bolt 72 defines outer threads in a bottom portion thereof corresponding to the inner threads of a corresponding post 61 of the back plate 6. An annular groove 76 is defined in the bolt 72 corresponding to a corresponding locking ring 78. The locking ring 78 comprises a through hole in a center thereof and a plurality of teeth around the hole.

Figure 3:
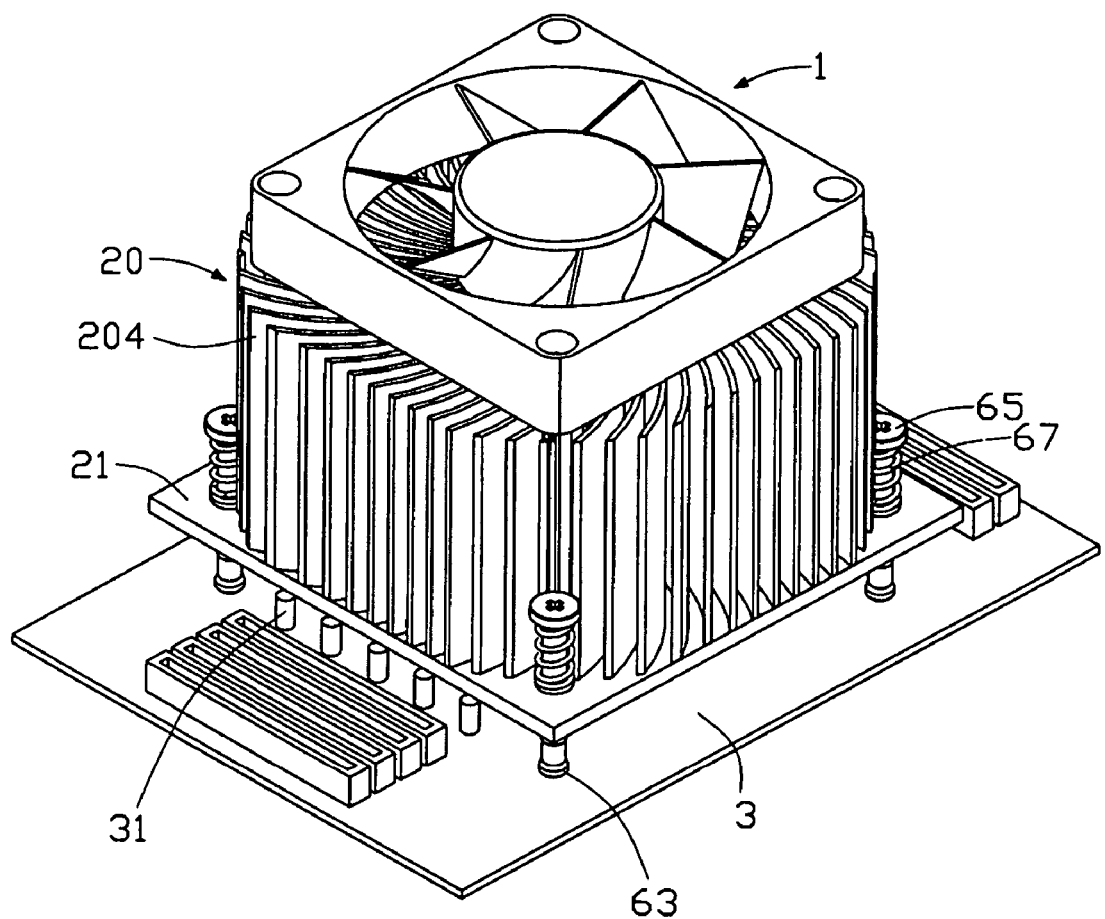
FIG. 3 is an assembled view of FIG. 1.

Referring to FIG. 3, in assembly, the fan 1 is mounted on the heat sink 20 of the radiator 2 by the screws 12 which extend through the through holes 16 of the fan 1 to engage in the screw holes 201 of the heat sink 20. The combined fan 1 and radiator 2 is then placed on the CPU 4 with the base 26 contact the CPU 4. The bolts 72 extend sequentially through the springs 77, the mounting holes 22 of the mounting plate 21, the locking rings 78 to engage with the posts 61, respectively. The locking rings 78 are received in the annular grooves 76 of the bolts 72 and abut a bottom surface of the mounting plate 21, for preventing the bolts 72 disengaging from the posts 61. The heat dissipation device is thus assembled to the PCB 3.

In operation, cooled air flow from the fan 1 passes through air passages between the fins 204 of the heat sink 20, the through openings 23 of the mounting plate 21 to blow to the CPU 4 and the other electronic components 31 adjacent the CPU 4.

In the present invention, the base 26 of the core 25 contact the CPU 4. A distance between the mounting plate 21 and the PCB 3 is equal to a thickness of the base 26 plus a thickness of the CPU 4. Thus, a larger space exists between the mounting plate 21 and the PCB 3 to allow the other electronic components 31 to be accommodated therein. Therefore, less space of the PCB 3 is waste below the mounting plate 21.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipation device for a heat generating component, the heat dissipation device comprising:
   a mounting plate for mounting the heat dissipation device to the heat generating component;
   a heat sink arranged on the mounting plate, the heat sink comprising a hollow cylinder and a plurality of fins extending outwardly from the cylinder; and
   a core comprising a base for contacting the heat generating component and a pole extending from the base through the mounting plate to be received in the cylinder of the heat sink thereby sandwiching the mounting plate between the base and the heat sink.

2. The heat dissipation device as claimed in claim 1, further comprising a fan mounted on the heat sink, wherein the mounting plate defines at least one opening located beside the pole for allowing cooled air from the fan to blow to the heat generating component.

3. The heat dissipation device as claimed in claim 2, wherein the fins are curved and a plurality of passages is defined between two adjacent fins.

4. The heat dissipation device as claimed in claim 1, wherein the pole is a hollow pipe with coolant filled therein.

5. The heat dissipation device as claimed in claim 1, wherein the pole is a solid rod made of conductive metal.

6. A heat dissipation device assembly comprising:
   a circuit board having a first electronic component and a plurality of second electronic components around the first electronic component mounted thereon;
   a core comprising a base contacting the first electronic component and a pole extending upwardly from the base;
   a mounting plate located above the base with the pole extending therethrough;
   a heat sink mounted on the mounting plate with the pole extending into the heat sink, the heat sink comprising hollow cylinder and a plurality of fins extending outwardly from the cylinder, the pole being received in the cylinder; and
   means for locking the mounting plate to the circuit board, wherein the second electronic components are located in space between the mounting plate and the circuit board.

7. The heat dissipation device assembly as claimed in claim 6, further comprising a fan mounted on the heat sink, wherein the mounting plate defines at least one opening located beside the pole to provide access for cooled air from the fan to the first electronic component and the plurality of second electronic components.

8. The heat dissipation device assembly as claimed in claim 7, wherein the at least one opening comprises four openings surrounding the pole.

9. The heat dissipation device assembly as claimed in claim 7, wherein the locking means comprises at least two posts extending from the circuit board, at least two bolts extending through the mounting plate to engage with the at least two posts, and at least two springs surrounded on the at least two bolts and pressing the mounting plate toward the circuit board.

10. The heat dissipation device assembly as claimed in claim 9, wherein the locking means further comprises at least two locking rings surrounded on the at least two bolts and abutting against the mounting plate opposite to the at least two springs.

11. The heat dissipation device assembly as claimed in claim 9, wherein each post defines a plurality of inner threads and each bolt forms a plurality of outer threads in a bottom portion thereof engaging with the inner threads of a corresponding post.

12. The heat dissipation device assembly as claimed in claim 9, further comprising a back plate located below the circuit board, wherein the at least two posts are formed on the back plate.

13. The heat dissipation device assembly as claimed in claim 12, further comprising an insulative plate sandwiched between the back plate and the circuit board.

14. The heat dissipation device assembly as claimed in claim 13, wherein each post defines an annular groove receiving a locking ring therein to thereby locking the back plate, the insulative plate and the circuit board together.

15. A heat dissipation device assembly comprising:
   a circuit board having a first electronic component and a plurality of second electronic components around the first electronic component mounted thereon;
   a thermally conductive base directly vertically contacting the first electronic component, said base horizontally dimensioned not larger than the first electronic component and vertically raising a distance;
   a thermally conductive pole extending from top of the base;
   a thermally conductive mounting plate located on the base;

a heat sink mounted on the mounting plate, the heat sink comprising a hollow cylinder and a plurality of fins extending outwardly from the cylinder, said pole being extended through the mounting plate and received in the cylinder; and means for fastening the mounting plate and the circuit board, wherein the second electronic components having heights essentially not smaller than that of the first electronic component, are located in space between the mounting plate and the circuit board under a condition that the distance is larger than the heights of said electronic components.

16. The heat dissipation device assembly as claimed in claim 15, wherein said second electronic components are radially located within a range defined by a circumference of said heat sink.

17. The heat dissipation device assembly as claimed in claim 15, wherein said base is discrete from the plate.

18. The heat dissipation device assembly as claimed in claim 15, wherein said plate is discrete from the heat sink.

19. The heat dissipation device assembly as claimed in claim 15, wherein said base is discrete from the heat sink.

20. The heat dissipation device assembly as claimed in claim 15, wherein the mounting plate defines a through aperture in a center thereof, and a plurality of through openings surrounding the through aperture for guiding cooled air flow therethrough to blow to the first electronic component and the plurality of second electronic components.

* * * * *